(12) United States Patent
Lai et al.

(10) Patent No.: US 8,299,532 B2
(45) Date of Patent: Oct. 30, 2012

(54) ESD PROTECTION DEVICE STRUCTURE

(75) Inventors: Tai-Hsiang Lai, Miaoli County (TW);
Kuei-Chih Fan, Hsin-Chu (TW);
Tien-Hao Tang, Hsinchu (TW)

(73) Assignee: United Microelectronics Corp.,
Science-Based Industrial Park, Hsin-Chu (TW)

( * ) Notice: Subject to any disclaimer, the term of this patent is extended or adjusted under 35 U.S.C. 154(b) by 275 days.

(21) Appl. No.: 12/544,225

(22) Filed: Aug. 20, 2009

(65) Prior Publication Data
US 2011/0042716 A1 Feb. 24, 2011

(51) Int. Cl.
*H01L 23/62* (2006.01)

(52) U.S. Cl. ........ 257/355; 257/557; 257/173; 257/360; 438/204; 438/208

(58) Field of Classification Search ........... 257/E27.019, 257/E27.038, E27.02, E27.022, E27.039, 257/140, 173, 47, 197, 273, 370, 378, 552, 257/423, 427, 474, 477, 511, 525, 526, 557, 257/565, 517, 527, 539, 542, 555, 575, 556, 257/355, 360, 168, 169, 162, 205, 367; 438/202, 438/203, 204, 205, 206, 207, 208
See application file for complete search history.

(56) References Cited

U.S. PATENT DOCUMENTS

| | | | |
|---|---|---|---|
| 5,602,416 A * | 2/1997 | Zambrano | 257/500 |
| 5,825,600 A | 10/1998 | Watt | |
| 6,353,247 B1 * | 3/2002 | Pan | 257/355 |
| 6,838,734 B2 | 1/2005 | Ker | |
| 6,946,690 B1 | 9/2005 | Vashchenko | |
| 7,638,857 B2 | 12/2009 | Hwang | |
| 7,851,314 B2 * | 12/2010 | Mallikarjunaswamy et al. | 438/286 |
| 2001/0050412 A1 * | 12/2001 | Patti | 257/565 |
| 2005/0110097 A1 * | 5/2005 | Chen | 257/369 |
| 2005/0194642 A1 * | 9/2005 | Kamiya et al. | 257/350 |
| 2006/0044719 A1 * | 3/2006 | Chen et al. | 361/56 |
| 2009/0127659 A1 * | 5/2009 | Shafi | 257/565 |
| 2010/0019318 A1 * | 1/2010 | Chao et al. | 257/336 |
| 2010/0244143 A1 * | 9/2010 | Yang et al. | 257/370 |

* cited by examiner

*Primary Examiner* — Ha Tran T Nguyen
*Assistant Examiner* — Thanh Y Tran
(74) *Attorney, Agent, or Firm* — Winston Hsu; Scott Margo

(57) ABSTRACT

An ESD protection device structure includes a well having a first conductive type, a first doped region having a second conductive type disposed in the well, a second doped region having the first conductive type, and a third doped region having the second conductive type disposed in the well. The second doped region is disposed within the first doped region so as to form a vertical BJT, and the first doped region, the well and the third doped region forms a lateral BJT, so that pulse voltage that the ESD protection structure can tolerate can be raised.

19 Claims, 8 Drawing Sheets

|  | Vt1(V) | It2(A) | HBM(KV) | MM(V) |
|---|---|---|---|---|
| Without implanting the second doped region | 51.3 | 1.46 | 1 | 275 |
| Px = 2.2 μm | 49.6 | 1.2 | 1.6 | 425 |
| Px = 1.2 μm | 49.5 | 1 | 2.2 | 425 |
| Px = 0.7 μm | 47.3 | 3.2 | 4.6 | 425 |
| Px = 0.2 μm | 45.1 | 4.2 | 4.8 | 500 |
| Px = 0 μm | 40.8 | 4.5 | 7 | 575 |

ESD PROTECTION DEVICE STRUCTURE

BACKGROUND OF THE INVENTION

1. Field of the Invention

The present invention relates to an electrostatic discharge (ESD) protection device structure, and more particularly, to an ESD protection device structure of a gate-grounded metal-oxide-semiconductor transistor.

2. Description of the Prior Art

Electrostatic discharge (ESD) usually occurs in semiconductor devices. The ESD phenomenon occurs when excess charges are transmitted from the input/output (I/O) pin to the integrated circuit too quickly, which damages the internal circuit. In order to solve such a problem, manufacturers normally build an ESD protection device between the internal circuit and the I/O pin. The ESD protection device is initiated before the ESD pulse enters the internal circuit for discharging the excess charges, and thus ESD-related damage is decreased.

Recently, in order to prevent the internal circuit from damage generated by ESD phenomenon, the prior-art ESD protection device uses a PMOS transistor and an NMOS transistor to protect the internal circuit. Generally, the discharge path of the ESD protection device includes four modes, such as a positive-to-VSS (PS) mode, a negative-to-VSS (NS) mode, a positive-to-VDD (PD) mode, and a negative-to-VDD (ND) mode. Under the PD and NS modes, the parasitic diodes at the PMOS transistor and the NMOS transistor are used to provide the ESD protection function. On the other hand, in the ND and PS modes, the parasitic bipolar transistors at the PMOS transistor and the NMOS transistor are used for protecting the internal circuit. However, the turned-on voltages of the parasitic bipolar transistors are high, and the gate oxide layer of the NMOS transistor or the PMOS transistor is becoming thinner with the continuing scaling-down of semiconductor integrated circuit (IC) device dimensions, thus the breakdown voltages of the gate oxide layer will become smaller, resulting in that the gate oxide layer easily burns out due to a high ESD current such that the prior-art ESD protection device loses its protection function.

As a result, how to provide an effective ESD protection device as the process scale and device spaces of ICs are continuously reduced is still one of the important issues to the manufacturers.

SUMMARY OF THE INVENTION

It is therefore an objective of the present invention to provide an electrostatic discharge (ESD) protection device structure to raise the ESD robustness in human body model and in machine model of the ESD protection device structure.

According to the present invention, an ESD protection device structure is disclosed. The ESD protection device structure is disposed in a semiconductor substrate, and the ESD protection device structure comprises a well having a first conductive type, a first doped region having a second conductive type and disposed in the well, a second doped region having the first conductive type, and a third doped region having the second conductive type and disposed in the well. The second doped region is disposed within the first doped region, and the first doped region and the second doped region form a first vertical bipolar junction transistor (BJT). The first doped region, the well and the third doped region form a lateral BJT.

The present invention implants the second doped region having different conductive type from the first doped region into the first heavy doped region and the first drift region of the ESD protection device structure so as to raise the secondary breakdown current and reduce the trigger voltage, so that the ESD protection device structure can tolerate larger ESD pulses.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
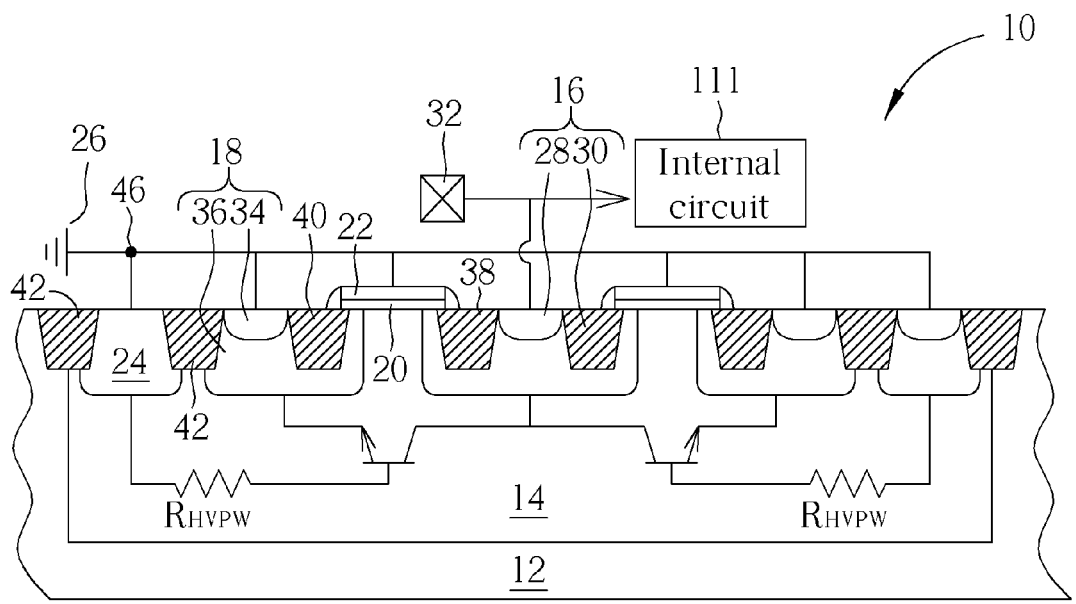
FIG. 1 is a cross-sectional schematic diagram illustrating an electrostatic discharge (ESD) protection device structure according to a first embodiment of the present invention.

Please refer to FIG. 1, which is a cross-sectional schematic diagram illustrating an electrostatic discharge (ESD) protection device structure according to a first embodiment of the present invention. As shown in FIG. 1, the ESD protection device structure 10 is disposed in a semiconductor substrate 12, and the ESD protection device structure 10 includes a well 14, a drain region 16, a source region 18, a gate dielectric layer 20, a gate electrode 22, and a doped region 24. The well 14 has a first conductive type, such as N-type or P-type, and is disposed in the semiconductor substrate 12. The drain region 16 and the source region 18 are respectively disposed in the well 14. The drain region 16 has a second conductive type, and the source region 18 also has the second conductive type.

The first embodiment takes the first conductive type being P-type and the second conductive type being N-type as an example. On the contrary, when the first conductive type is N-type, the second conductive type is P-type. The gate dielectric layer 20 is disposed on the semiconductor substrate 12 between the drain region 16 and the source region 18, and the gate electrode 22 is disposed on the gate dielectric layer 20, so that the drain region 16, the source region 18, the well 14, the gate dielectric layer 20 and the gate electrode 22 forms an N-type metal-oxide-semiconductor (MOS) transistor. The doped region 24 is disposed in the well 14 and electrically connected to a ground end 26. The doped region 24 is used to electrically connect the well 14 and the ground end 26, and can be regarded as a body electrode 46 of the MOS transistor.

In addition, the drain region 16 can include an N-type first heavy doped region 28 and an N-type first drift region 30. The first heavy doped region 28 is disposed on the first drift region 30, and the first heavy doped region 28 is electrically connected between an internal circuit 31 required to be protected and an input/output (I/O) conducting pad 32. The drain region 19 also can include an N-type second heavy doped region 34 and an N-type second drift region 36, and the second heavy doped region 34 is disposed on the second drift region 36 and electrically connected to the ground end 26. Therefore, the ESD protection device structure 10 of this embodiment is a gate-grounded N-type MOS transistor. Furthermore, the ESD protection device structure 10 further can include a first isolation structure 38, a second isolation structure 40 and a third isolation structure 42. The first isolation structure 38 is surrounding the first heavy doped region 28, and the second isolation structure 40 is disposed in the source region 18. The third isolation structure 42 is surrounding the doped region 24 to isolate the doped region 24 and the MOS transistor.

Figure 2:
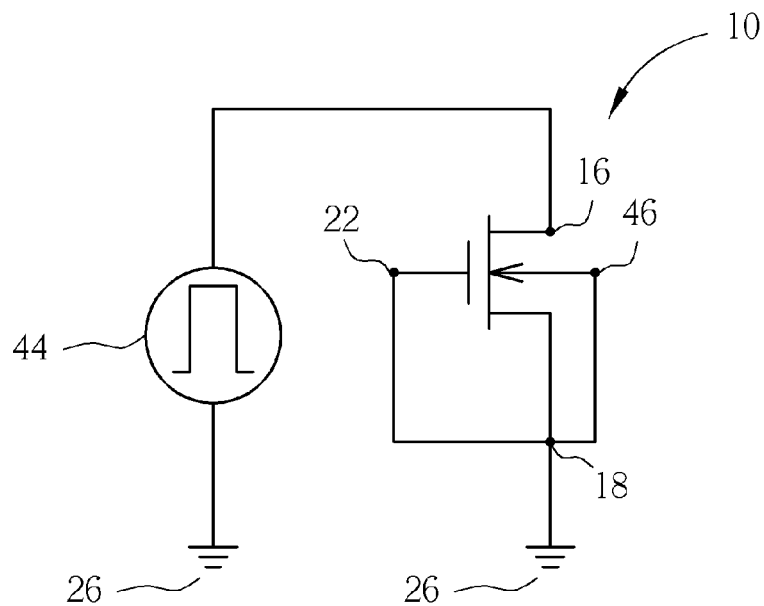
FIG. 2 is a schematic diagram illustrating a circuit in the TLP test for the ESD protection device structure according to the first embodiment of the present invention.
Figure 3:
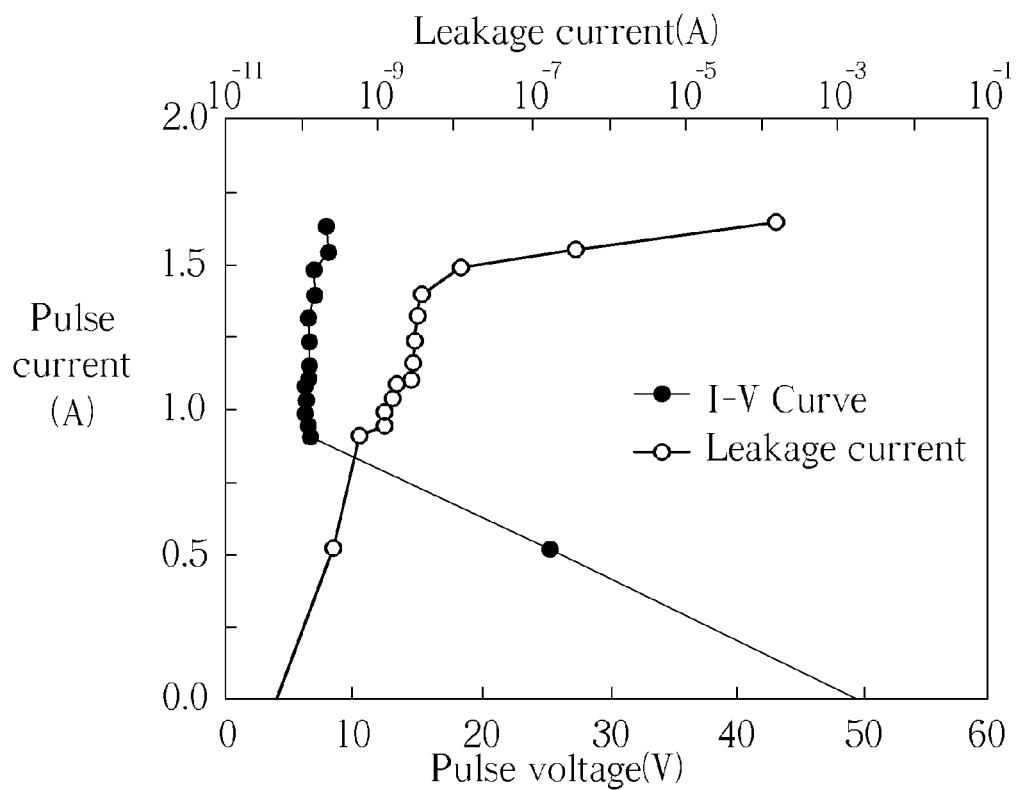
FIG. 3 is a schematic diagram illustrating a relation of the pulse voltage and the pulse current and a relation of leakage current of the gate electrode and the pulse current of the ESD protection device structure according to the first embodiment of the present invention in the TLP test.
Figure 4:
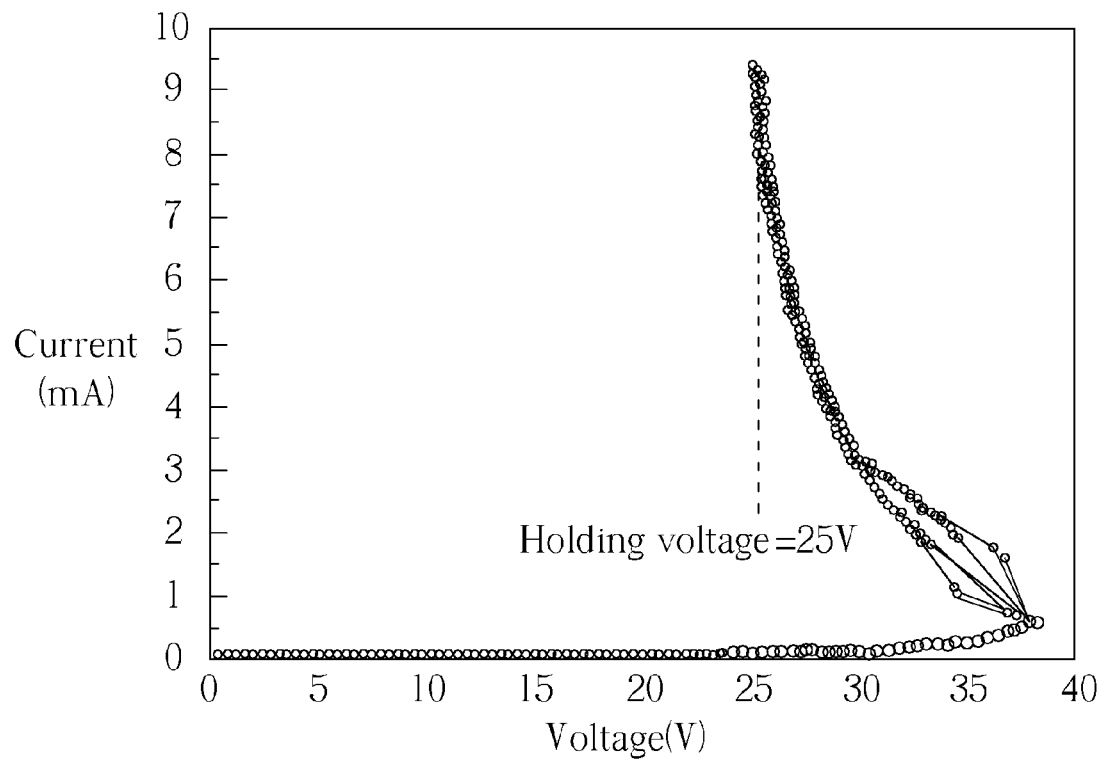
FIG. 4 is a schematic diagram illustrating a relation of operating voltage and operating current of the ESD protection device structure according to the first embodiment of the present invention.

The relation of pulse voltage and pulse current of the ESD protection device structure of this embodiment in the transmission line pulse (TLP) test is further described in the following description so as to simulate the tolerated range of the ESD protection device structure during electrostatic discharging, and further, the ESD protection capability of the ESD protection device structure can be shown. Please refer to FIG. 2 through FIG. 4. FIG. 2 is a schematic diagram illustrating a circuit in the TLP test for the ESD protection device structure according to the first embodiment of the present invention. FIG. 3 is a schematic diagram illustrating a relation of the pulse voltage and the pulse current and a relation of leakage current of the gate electrode and the pulse current of the ESD protection device structure according to the first embodiment of the present invention in the TLP test. FIG. 4 is a schematic diagram illustrating a relation of operating voltage and operating current of the ESD protection device structure according to the first embodiment of the present invention. As shown in FIG. 2, in the TLP test, the drain region 16 of the ESD protection device structure 10 is electrically connected to an end of a TLP generator 44, and the source region 18, the gate electrode 22 and the body electrode 46 of the ESD protection device structure is electrically connected to the ground end. Furthermore, the other end of the TLP generator 44 is electrically connected to the ground end. As shown in FIG. 3, a secondary breakdown current It2 is a value of the pulse current of the ESD protection device structure 10 when the leakage current of the gate electrode 22 is $10^{-6}$ A. The secondary breakdown current It2 is substantially 1.5 A, and pulse voltage in human-body model (HBM) that the ESD protection device structure 10 can tolerate is substantially 1 kV. The pulse voltage in machine model (MM) that the ESD protection device structure 10 can tolerate is 275 V. In addition, from FIG. 3, a trigger voltage of the ESD protection device structure 10 can be obtained to be substantially 50 V. This means that the ESD protection device structure 10 is turned on to start ESD protection when the ESD pulse voltage is over 50 V. Furthermore, as shown in FIG. 4, a holding voltage of the ESD protection device structure 10 is substantially 25 V, and then, power consumption of the ESD protection device structure 10 can be obtained from the formula: power consumption=ESD current×holding voltage.

However, specification of the industry for ESD protection in the HBM is 2 kV. Therefore, the ESD protection capability of the above-mentioned embodiment is still too low to reach the specification of the industry for ESD protection. In order to raise the ESD protection capability, the present invention implants a doped region having the second conductive type into the drain region so as to form a vertical bipolar junction transistor (BJT), and the ESD protection capability can be therefore raised.

Figure 5:
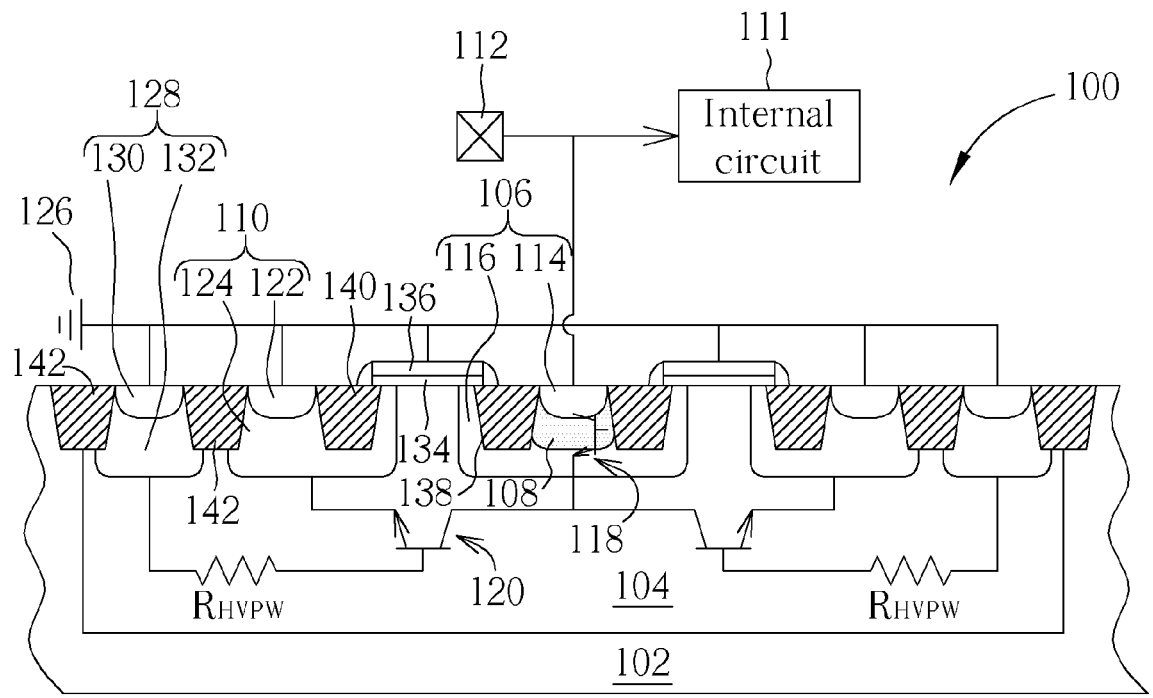
FIG. 5 is a cross-sectional schematic diagram illustrating an ESD protection device structure according to a second embodiment of the present invention.

Please refer to FIG. 5, which is a cross-sectional schematic diagram illustrating an ESD protection device structure according to a second embodiment of the present invention. As shown in FIG. 5, the ESD protection device structure 100 is disposed in a semiconductor substrate 102, and the ESD protection device structure 100 includes a well 104 having a first conductive type, a first doped region 106 having a second conductive type and used to be a drain, a second doped region 108 having the first conductive type, and a third doped region 110 having the second conductive type and used to be a source. Similarly, when the first conductive type is P-type, the second conductive type is N-type. On the contrary, when the first conductive type is N-type, the second conductive type is P-type.

The second embodiment takes the first conductive type being P-type as an example, and the well 104 is a high voltage P-well (HVPW) disposed in the semiconductor substrate 102. The N-type first doped region 106 is disposed in the well 104 and electrically connected to an internal circuit 111 that require to be protected and an I/O conducting pad 112. The first doped region 106 includes an N-type first heavy doped region 114 and an N-type first drift region 116, and the first heavy doped region 114 is disposed on the first drift region 116. It should be noted that the P-type second doped region 108 is disposed within the first doped region 106, and the second doped region 108 is disposed between the first heavy doped region 114 and the first drift region 116 and totally isolates the first heavy doped region 114 and the first drift region 116, so that the first doped region 106 and the second doped region 108 forms an n-p-n BJT, which is a vertical BJT 118. In this embodiment, the first heavy doped region 114 is electrically connected to the I/O conducting pad 112 so as to discharge electrostatic charges. The N-type third doped region 110 is disposed in the well 104 of a side of the first doped region 106, so that the first doped region 106, the well 104 and the third doped region 110 forms another n-p-n BJT, which is a lateral BJT 120. The third doped region 110 includes an N-type second heavy doped region 122 and an N-type second drift region 124, and the second heavy doped region 122 is disposed on the second drift region 124 and electrically connected to a ground end 126. In this embodiment, the second doped region 110 is P-type, and can be formed by a P-type ESD implantation process, such as a boron ion implantation process. The depth of the second doped region 110 in the semiconductor substrate 102 can be controlled by adjusting implantation energy.

In addition, the ESD protection device structure 100 of this embodiment further includes a P-type fourth doped region 128 disposed in the well 104 and electrically connected to the ground end 126, and the fourth doped region 128 is used to electrically connect the ground end 126 and the well 104, so that a base electrode of the lateral BJT 120 can be electrically connected to the ground end 126 through the well 104 and the fourth doped region 128. Furthermore, the well 104 between the lateral BJT 120 and the fourth doped region 128 has a resistance $R_{HVPW}$. When a voltage drop across the resistance $R_{HVPW}$ is larger than cut-in voltage of the lateral BJT 120, the lateral BJT 120 is turned on. The fourth doped region 128 of this embodiment can include a third heavy doped region 130 and a third drift region 132, and the third heavy doped region 130 is disposed on the third drift region 132 and electrically connected to the ground end 126. The present invention is not limited that the fourth doped region should include heavy doped region and drift region or the fourth doped region is a P-type doped region, and the fourth doped region also can be a doped region having a same conductive type as the well 104.

In this embodiment, the ESD protection device structure 100 further includes a gate dielectric layer 134 and a gate electrode 136. The gate dielectric layer 134 is disposed on the semiconductor substrate 102, and located between the N-type first doped region 106 and the N-type third doped region 110. The gate dielectric layer 134 partially overlaps the first doped region 106 and the third doped region 110, but is not limited to this. The gate electrode 136 is disposed on the gate dielectric layer 134, so that the gate dielectric layer 134, the gate electrode 136, the N-type first doped region 106, the N-type third doped region 110 and the P-type well 104 form an N-type MOS transistor. The first doped region 106 can be regarded as the drain of the MOS transistor, and the third doped region 110 can be regarded as the source of the MOS transistor. The well 104 adjacent to the gate dielectric layer 134 can be used to be a channel region of the MOS transistor. In addition, the gate electrode 136 is electrically connected to the ground end 126, so that the N-type MOS transistor can be in off-state when no ESD is generated.

Furthermore, the ESD protection device structure 100 further includes a first isolation structure 138, a second isolation structure 140 and a third isolation structure 142. The first isolation structure 138 is surrounding the first heavy doped region 114, and is used to isolate sidewalls of the first heavy doped region 114 and the first drift region 116, so that the ESD current from the first heavy doped region 114 first passes through the second doped region 108 having the second conductive type, and then passes through the path, which is constructed by the first drift region 116, the well 104 and the third doped region 110 of the lateral BJT 120, and to the ground end 126. When a high ESD pulse voltage is injected to the first heavy doped region 114, the first isolation structure 138 can effectively protect the gate dielectric layer 134 from being damaged by the ESD so as to raise the ESD robustness of the ESD protection device structure 100 at the I/O conducting pad 112 for ESD pulse voltage. The second isolation structure 140 is disposed in the third doped region 110 and located between the connecting point of the second heavy doped region 122 and the ground end 126 and the second drift region 124 disposed under the gate electrode 136. The second isolation structure 140 is used to prevent the gate dielectric layer 134 from being damaged by the high ESD voltage injected from the ground end 126. The third isolation structure 142 is surrounding the P-type fourth doped region 128, and is used to isolate the fourth doped region 128 and the N-type MOS transistor.

Figure 6:
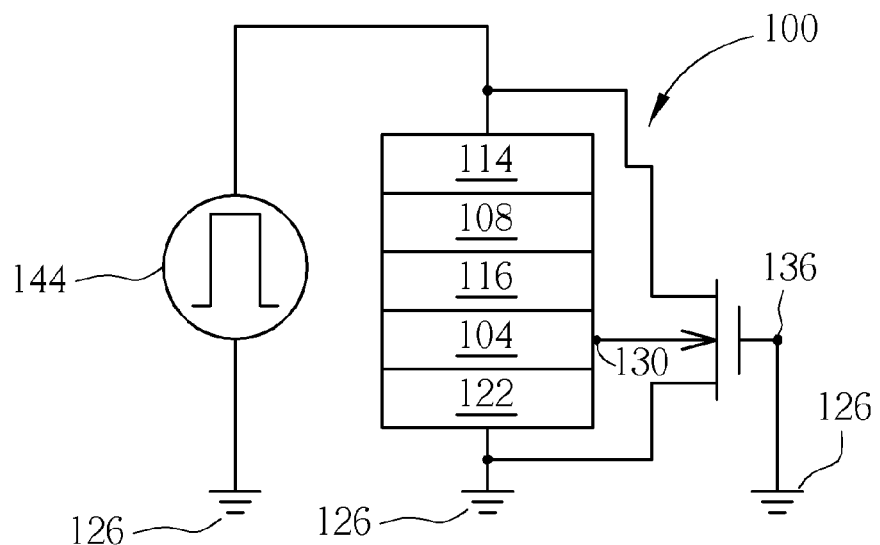
FIG. 6 is a schematic diagram illustrating a circuit in the TLP test for the ESD protection device structure according to the second embodiment of the present invention.
Figure 7:
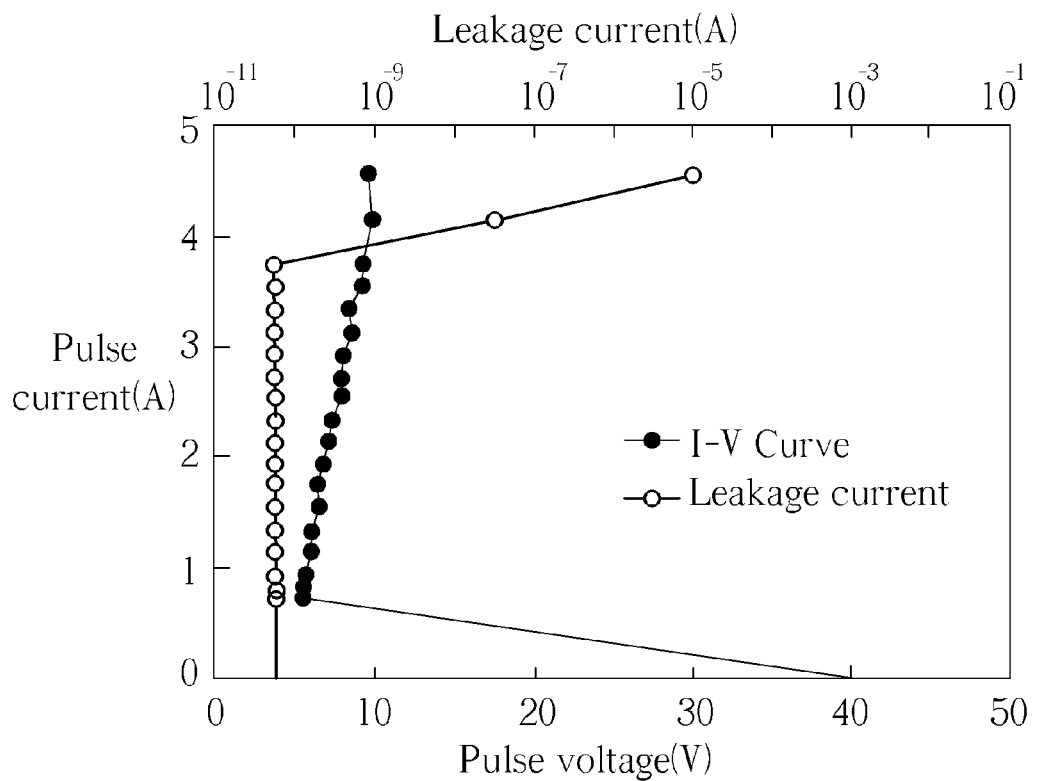
FIG. 7 is a schematic diagram illustrating a relation of the pulse voltage and the pulse current and a relation of leakage current of the gate electrode and the pulse current of the ESD protection device structure according to the second embodiment of the present invention in the TLP test.

In order to compare the ESD protection capability of the second embodiment and the above-mentioned first embodiment, the following description will further describe the relation of the pulse voltage and pulse current of the ESD protection device structure of this embodiment in the TLP test, and compare with the result of the first embodiment. Please refer to FIG. 6 and FIG. 7. FIG. 6 is a schematic diagram illustrating a circuit in the TLP test for the ESD protection device structure according to the second embodiment of the present invention. FIG. 7 is a schematic diagram illustrating a relation of the pulse voltage and the pulse current and a relation of leakage current of the gate electrode and the pulse current of the ESD protection device structure according to the second embodiment of the present invention in the TLP test. As shown in FIG. 6, the first heavy doped region 114 of the ESD protection device structure 100 according to this embodiment is electrically connected to an end of the TLP generator 144, and the second heavy doped region 122, the gate electrode 136 and the third heavy doped region 130 of the ESD protection device structure 100 are electrically connected to the ground end 126. The other end of the TLP generator 144 is also electrically connected to the ground end 126. As shown in FIG. 7, compared with the secondary breakdown current It2 of the first embodiment, which is 1.5 A, the secondary breakdown voltage It2 (the pulse current when the leakage current of gate electrode is over $10^{-6}$ A) of the ESD protection device structure 100 of the second embodiment is substantially 4.2 A, and the ESD protection device structure 100 can therefore tolerate higher ESD pulse current. In addition, the pulse voltage in the HBM that the ESD protection device structure 100 can tolerate is substantially 7 kV, which can be obtained from the secondary breakdown current It2 of the second embodiment, higher than 1 kV of the first embodiment, and can reach the specification of the industry for ESD protection, which is 2 kV. In the MM, the pulse voltage that the ESD protection device structure of the second embodiment can tolerate is 575 V, higher than the pulse voltage of the first embodiment, which is 275 V. Furthermore, compared with the trigger voltage Vt1 of the first embodiment being 50 V, the trigger voltage Vt1 of the ESD protection device structure of the second embodiment is substantially 40 V, so that the trigger voltage of the ESD protection device structure can be effectively reduced when ESD generates. Therefore, the tolerated range of the internal circuit for the ESD pulse can be raised.

Figure 8:
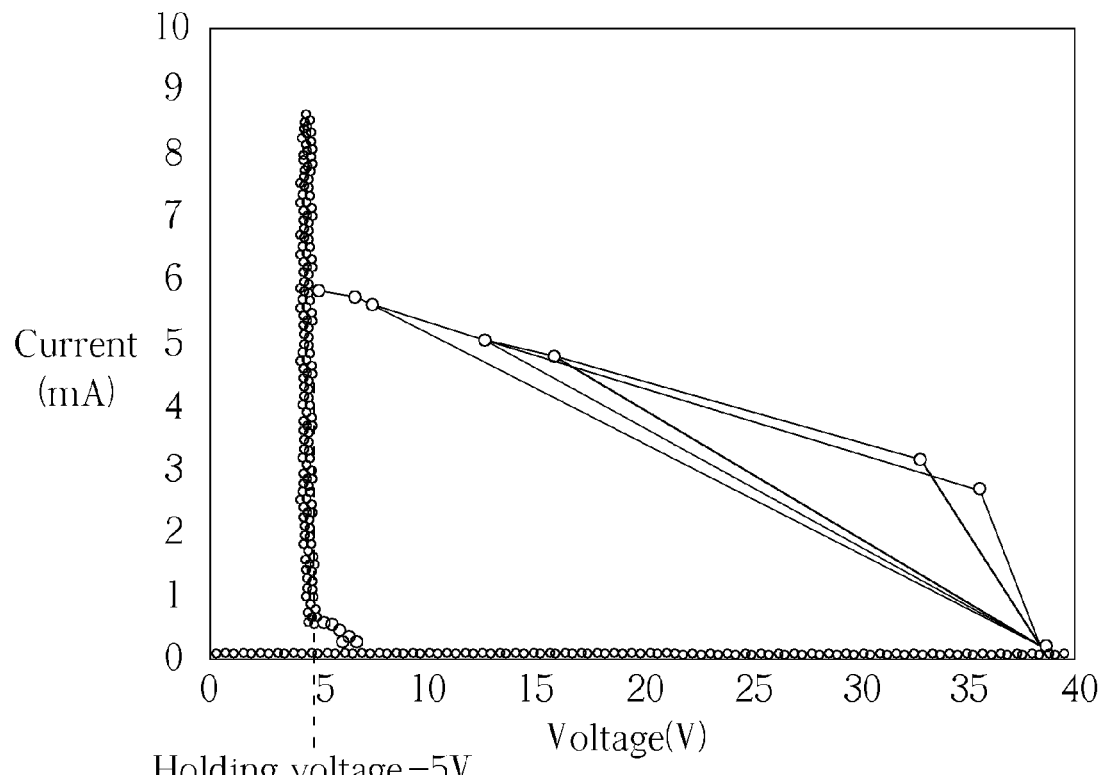
FIG. 8 is a schematic diagram illustrating a relation of operating voltage and operating current of the ESD protection device structure according to the second embodiment of the present invention.

Please refer to FIG. 8, which is a schematic diagram illustrating a relation of operating voltage and operating current of the ESD protection device structure according to the second embodiment of the present invention. As shown in FIG. 8, compared with the holding voltage of the first embodiment, which is 25 V, the holding voltage of the ESD protection device structure of the second embodiment is only 5 V. Accordingly, power consumption of the ESD protection device structure can be effectively reduced. Impedance of the ESD protection device structure can therefore be reduced. This means the ESD protection device structure of this embodiment has a low impedance path formed by implanting the P-type second doped region into the N-type first doped region. The low impedance path, which is the first heavy doped region, the second doped region, the first drift region, the well and the third doped region in sequence, can direct the ESD current form the I/O conducting pad to the ground end. When the ESD voltage is larger than a breakdown voltage of a junction of the N-type first heavy doped region and the P-type second doped region, and the voltage drop across the resistance $R_{HVPW}$ is larger than the cut-in voltage of the lateral n-p-n BJT, the ESD current can pass through the low impedance path formed by turning on the vertical n-p-n BJT and the lateral n-p-n BJT, and can be directed to the ground end so as to effectively protect the internal circuit.

Figures 9, 10:
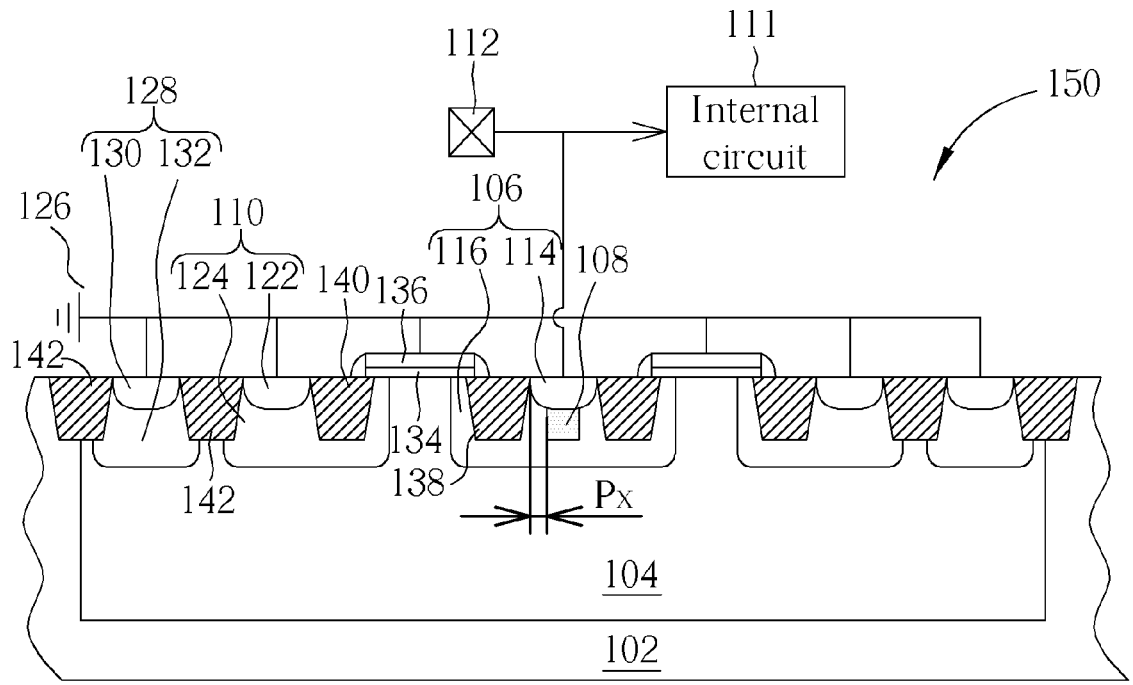
FIG. 9 is a cross-sectional schematic diagram illustrating an ESD protection device structure according to a third embodiment of the present invention.
FIG. 10 is a table illustrating experiment results of the ESD protection device structures of the present invention having different contact widths of the first heavy doped region and the first drift region measured in the TLP test and the corresponding ESD pulse voltages that the ESD protection device structures can tolerate.

In addition, the second doped region of the present invention is not limited to isolating the first heavy doped region and the first drift region, and the first heavy doped region can be in contact with the first drift region. In order to compare the difference between the second embodiment and other embodiments, portions of the structure of the following embodiments that are the same as the second embodiment use the same labels, and will not be detailed redundantly. Please refer to FIG. 9 and FIG. 10. FIG. 9 is a cross-sectional schematic diagram illustrating an ESD protection device structure according to a third embodiment of the present invention. FIG. 10 is a table illustrating experiment results of the ESD protection device structures of the present invention having different contact widths of the first heavy doped region and the first drift region measured in the TLP test and the corresponding ESD pulse voltages that the ESD protection device structures can tolerate. As shown in FIG. 9, compared with the second embodiment, the P-type second doped region 108 of the ESD protection device structure 150 according to the third embodiment does not totally isolate the N-type first heavy doped region 114 and the first drift region 116, so that the first heavy doped region 114 is partially in contact with the first drift region 116. In this embodiment, the second doped region 108 is disposed right under the first heavy doped region 114, and the first heavy doped region 114 and the first drift region 116 have a contact width Px, but the present invention is not limited to this condition. The second doped region 108 also can be shifted to the left side or right side. As shown in FIG. 10, when the contact width is larger and larger, the secondary breakdown current It2 is lower and lower, and the trigger voltage Vt1 is higher and higher. Therefore, the ESD protection device structure without implanting the second doped region has the lowest pulse voltage that can be tolerated, and the pulse voltage that the ESD protection device structure can tolerate is gradually increased when the contact width Px is gradually reduced. Since the first heavy doped region and the first drift region are totally isolated, the ESD protection device structure can tolerate the largest pulse voltage.

Figure 11:
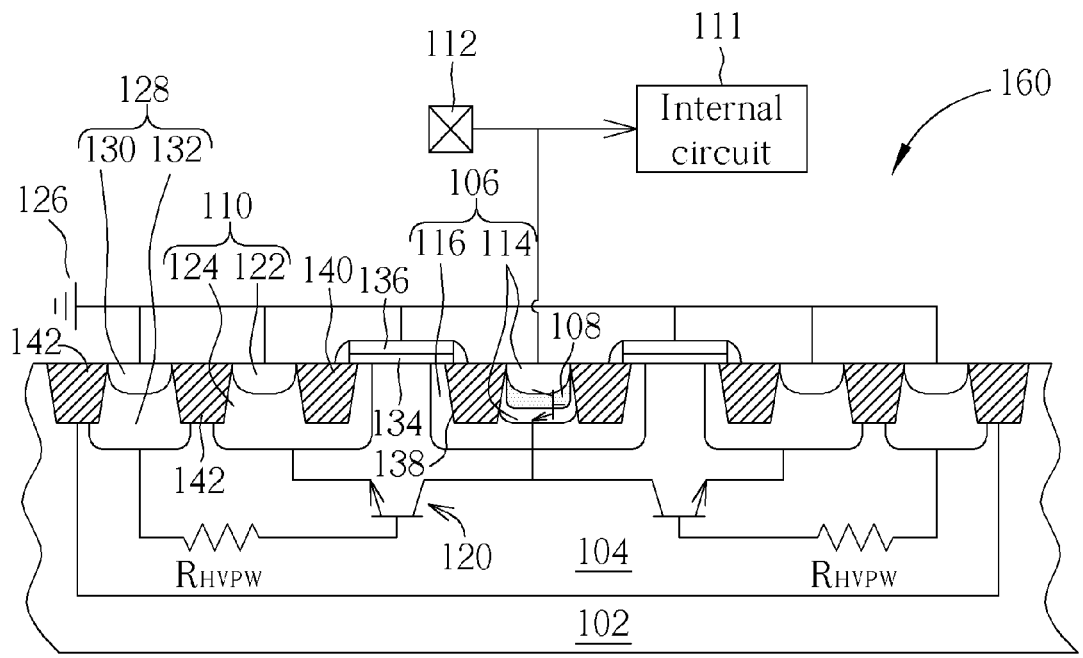
FIG. 11 through FIG. 15 are cross-sectional schematic diagrams illustrating the ESD protection device structure according to a fourth embodiment through an eighth embodiment of the present invention.
Figure 12:
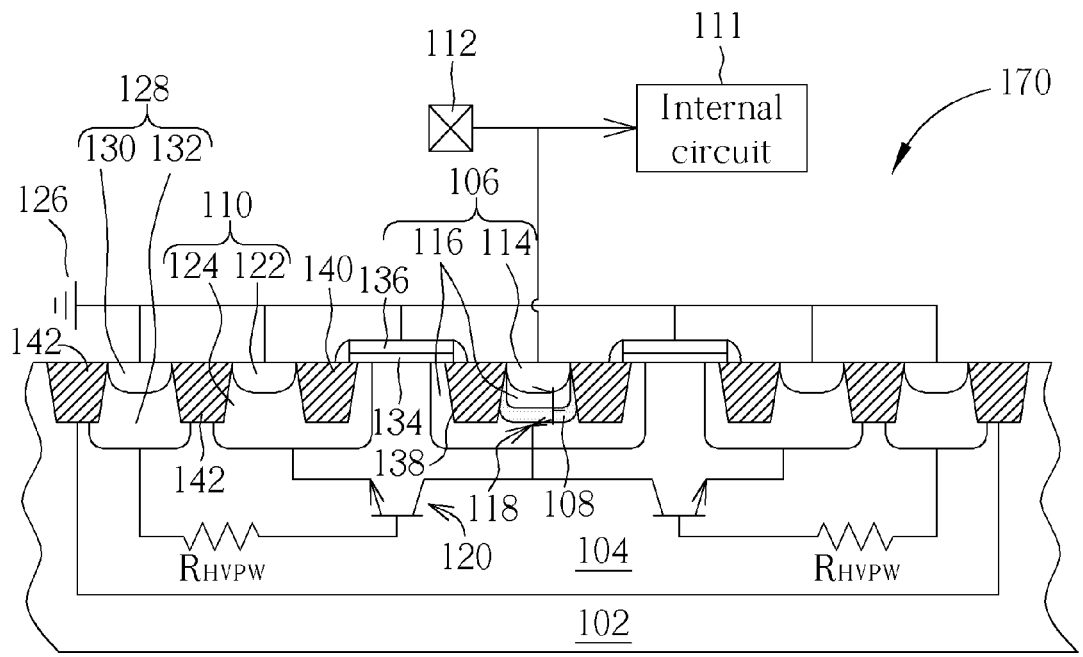
Figure 13:
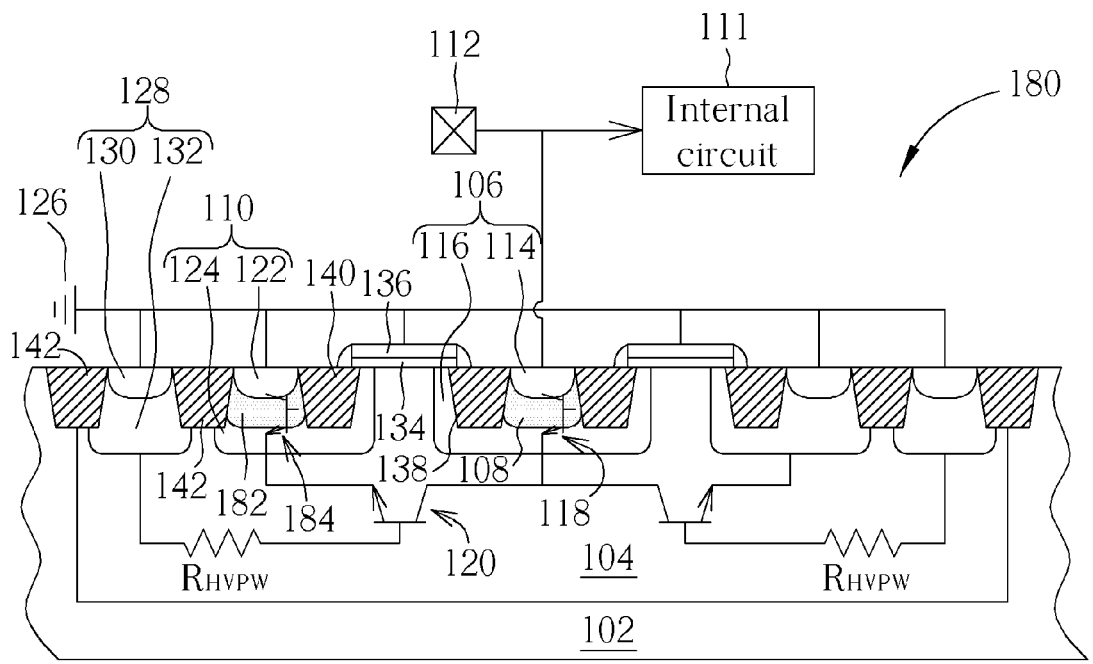

The ESD protection device structure of the present invention also can have other varied structures. Please refer to FIG. 11 through FIG. 15, which are cross-sectional schematic diagrams illustrating the ESD protection device structure according to a fourth embodiment through an eighth embodiment of the present invention. As shown in FIG. 11, compared with the second embodiment, the second doped region 108 of the ESD protection device structure 160 of the fourth embodiment is disposed within the first heavy doped region 114, and the second doped region 108 is not in contact with the first drift region 116. As shown in FIG. 12, the second doped region 108 of the ESD protection device structure 170 of the fifth embodiment is disposed within the first drift region 116, and the second doped region 108 is not in contact with the first heavy doped region 114. This means that position and size of the second doped region 108 can be adjusted according to different processes or product requirements so as to construct the second, third, fourth and fifth embodiments. In addition, as shown in FIG. 13, compared with the second embodiment, the ESD protection device structure 180 of the sixth embodiment further includes a fifth doped region 182 having the first conductive type, and the fifth doped region 182 is disposed within the third doped region 110 having the second conductive type so as to form another vertical BJT 184, such as n-p-n BJT, with the third doped region 110 and the fifth doped region 182. In the sixth embodiment, the fifth doped region 182 is disposed between the second heavy doped region 122 and the second drift region 124, but the present invention is not limited to this condition. The fifth doped region 182 also can be disposed within the second heavy doped region 122 or within the second drift region 124 similar to position of the second doped region 108 corresponding to the first heavy doped region 114 and the first drift region 116, and other extended embodiments can be constructed.

Figure 14:
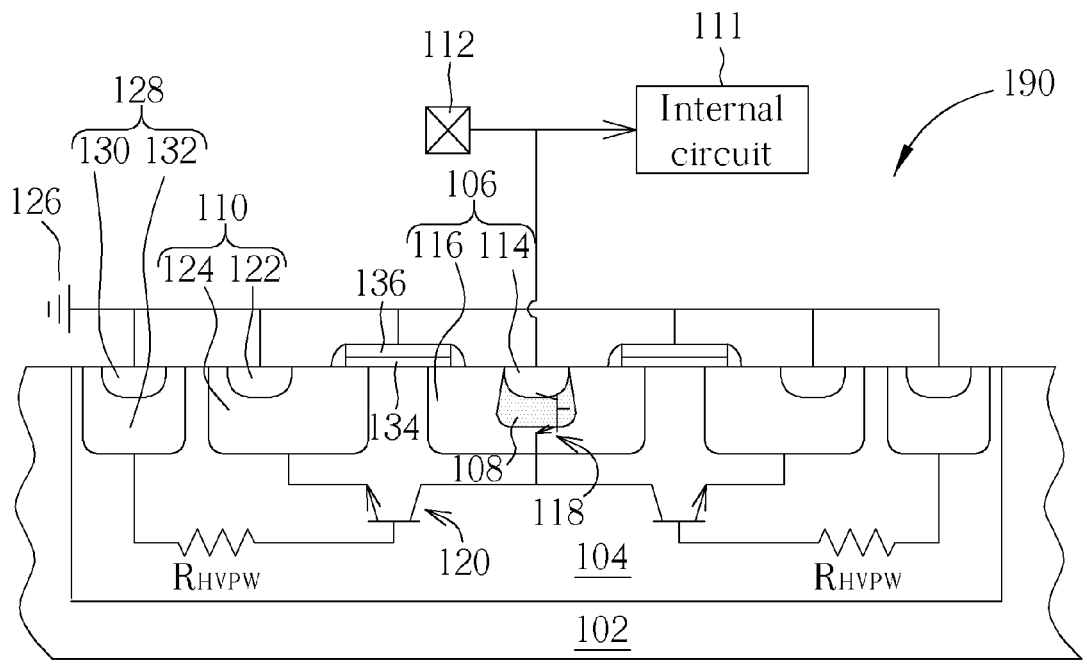
Figure 15:
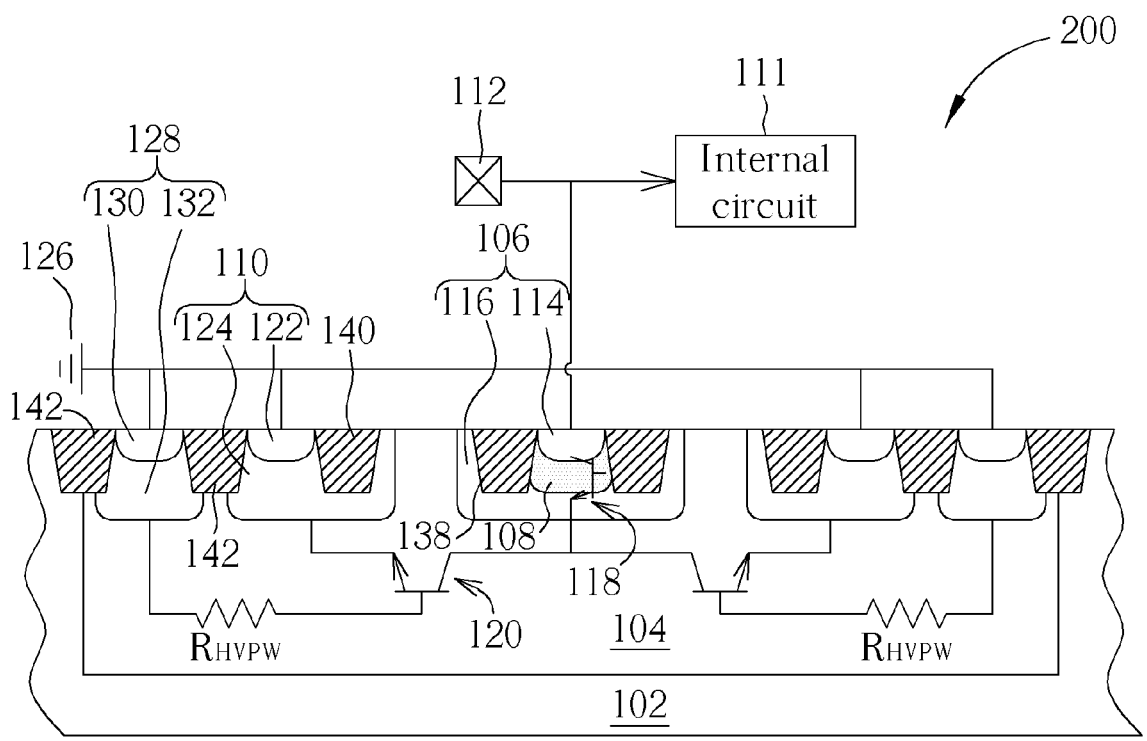

As shown in FIG. 14, compared with the second embodiment, the ESD protection device structure 190 of the seventh embodiment 190 does not include the first isolation structure, the second isolation structure and the third isolation structure, and can be used in an operating environment of low voltage. The present invention is not limited to this condition, and the present invention also can be the ESD protection device structure, which does not include third isolation structure only, does not include the first isolation structure and the second isolation only or does not include the first isolation structure only. In addition, as shown in FIG. 15, compared with the second embodiment, the ESD protection device structure 200 of the eighth embodiment does not include the gate electrode and the gate dielectric layer. In the eighth embodiment, the ESD protection device structure still can use the low impedance path formed by the first heavy doped region 114, the second doped region 108, the first drift region 116, the well 104 and the third doped region 110 to direct the ESD current from the I/O conducting pad 112 to the ground end 126. When the ESD voltage larger than a breakdown voltage of a junction of the N-type first heavy doped region 114 and the P-type second doped region 108, and the voltage drop across the resistance $R_{HVPW}$ is larger than the cut-in voltage of the lateral n-p-n BJT 120, the ESD current can pass through the low impedance path formed by turning on the vertical n-p-n BJT 118 and the lateral n-p-n BJT 120, and can be directed to the ground end 126. Furthermore, the present invention also can be the ESD protection device structure, which does not include at least one isolation structure in the same time or does not include the first isolation, the second isolation structure and the third isolation structure in the same time.

As the above-mentioned description, the present invention uses the ESD implantation process to form the second doped region having different conductive type from the first doped region in the first heavy doped region and the first drift region of the ESD protection device structure so as to form a low impedance path, which is constructed by the first heavy doped region, the second doped region, the first drift region, the well and the third doped region. Therefore, the secondary breakdown current can be raised, and the trigger voltage can be reduced, so that the ESD protection device structure can tolerate higher ESD pulse voltage.

Those skilled in the art will readily observe that numerous modifications and alterations of the device and method may be made while retaining the teachings of the invention.

What is claimed is:

1. An electrostatic discharge (ESD) protection device structure, disposed in a semiconductor substrate, and the ESD protection device structure comprising:
   a well, having a first conductive type;
   a first doped region, having a second conductive type and disposed in the well;
   a second doped region, having the first conductive type, the second doped region disposed within the first doped region, and the first doped region and the second doped region forming a first vertical bipolar junction transistor (BJT), wherein a part of the first doped region is disposed on the second doped region, and another part of the first doped region is disposed under the second doped region; and a third doped region, having the second conductive type, the third doped region disposed in the well, and the first doped region, the well and the third doped region forming a lateral BJT, wherein the well is disposed between the first doped region and the third doped region.

2. The ESD protection device structure of claim 1, wherein the first doped region comprises a first heavy doped region and a first drift region, and the first heavy doped region is disposed on the first drift region.

3. The ESD protection device structure of claim 2, wherein the second doped region is disposed between the first heavy doped region and the first drift region.

4. The ESD protection device structure of claim 3, wherein the second doped region totally isolates the first heavy doped region and the first drift region.

5. The ESD protection device structure of claim 3, wherein the first heavy doped region is in contact with the first drift region.

6. The ESD protection device structure of claim 2, wherein the second doped region is disposed within the first heavy doped region.

7. The ESD protection device structure of claim 2, wherein the second doped region is disposed within the first drift region.

8. The ESD protection device structure of claim 2, further comprising a first isolation structure, surrounding the first heavy doped region.

9. The ESD protection device structure of claim 8, further comprising a second isolation structure disposed in the third doped region.

10. The ESD protection device structure of claim 2, wherein the first heavy doped region is electrically connected to a conducting pad.

11. The ESD protection device structure of claim 1, further comprising a gate dielectric layer and a gate electrode, the gate dielectric layer disposed on the semiconductor substrate between the first doped region and the third doped region and partially covering the first doped region and the third doped region, and the gate electrode disposed on the gate dielectric layer.

12. The ESD protection device structure of claim 11, wherein the gate electrode is electrically connected to a ground end.

13. The ESD protection device structure of claim 1, further comprising a fourth doped region, having the first conductive type and disposed in the well.

14. The ESD protection device structure of claim 13, wherein the fourth doped region electrically connects a ground end and the well.

15. The ESD protection device structure of claim 13, further comprising a third isolation structure, surrounding the second doped region, and used to isolate the second doped region.

16. The ESD protection device structure of claim 1, wherein the third doped region comprises a second heavy doped region and a second drift region, and the second heavy doped region is disposed on the second drift region.

17. The ESD protection device structure of claim 1, further comprising a fifth doped region, having the first conductive type, the fifth doped region disposed within the third doped region, and the third doped region and the fifth doped region forming a second vertical BJT.

18. The ESD protection device structure of claim 1, wherein the third doped region is electrically connected to a ground end.

19. The ESD protection device structure of claim 1, wherein the first conductive type is P-type, and the second conductive type is N-type.

* * * * *